United States Patent [19]

Silverstein et al.

[11] Patent Number: 4,800,375

[45] Date of Patent: Jan. 24, 1989

[54] FOUR COLOR REPETITIVE SEQUENCE MATRIX ARRAY FOR FLAT PANEL DISPLAYS

[75] Inventors: Louis D. Silverstein, Scottsdale; Robert W. Monty, Phoenix, both of Ariz.

[73] Assignee: Honeywell Inc., Minneapolis, Minn.

[21] Appl. No.: 922,659

[22] Filed: Oct. 24, 1986

[51] Int. Cl.[4] .................................................. G09G 3/20
[52] U.S. Cl. ..................................... 340/703; 340/701; 358/240
[58] Field of Search ............... 340/701, 702, 703, 784, 340/783; 358/240, 56, 71

[56] References Cited

U.S. PATENT DOCUMENTS 3,961,365  6/1976  Payne et al. .................... 358/240
4,513,281  4/1985  Ngo ................................ 340/703
4,600,274  7/1986  Morozumi ....................... 340/703
4,622,881  11/1986  Rand ............................. 340/701
4,642,619  2/1987  Togashi .......................... 340/701

Primary Examiner—Marshall M. Curtis
Attorney, Agent, or Firm—Seymour Levine; Albin Medved; Roger W. Jensen

[57] ABSTRACT

A four color repetitive sequence matrix array for flat panel displays is formed by establishing a repetitive sequence with pixels of four different colors arranged in the rows of the matrix. The sequence commences with a different color in each row, thereby establishing a second repetitive sequence in the matrix columns. These row and column sequences establish a pattern of 16 pixels with sets of four rows and four columns that is repetitive throughout the array.

1 Claim, 4 Drawing Sheets

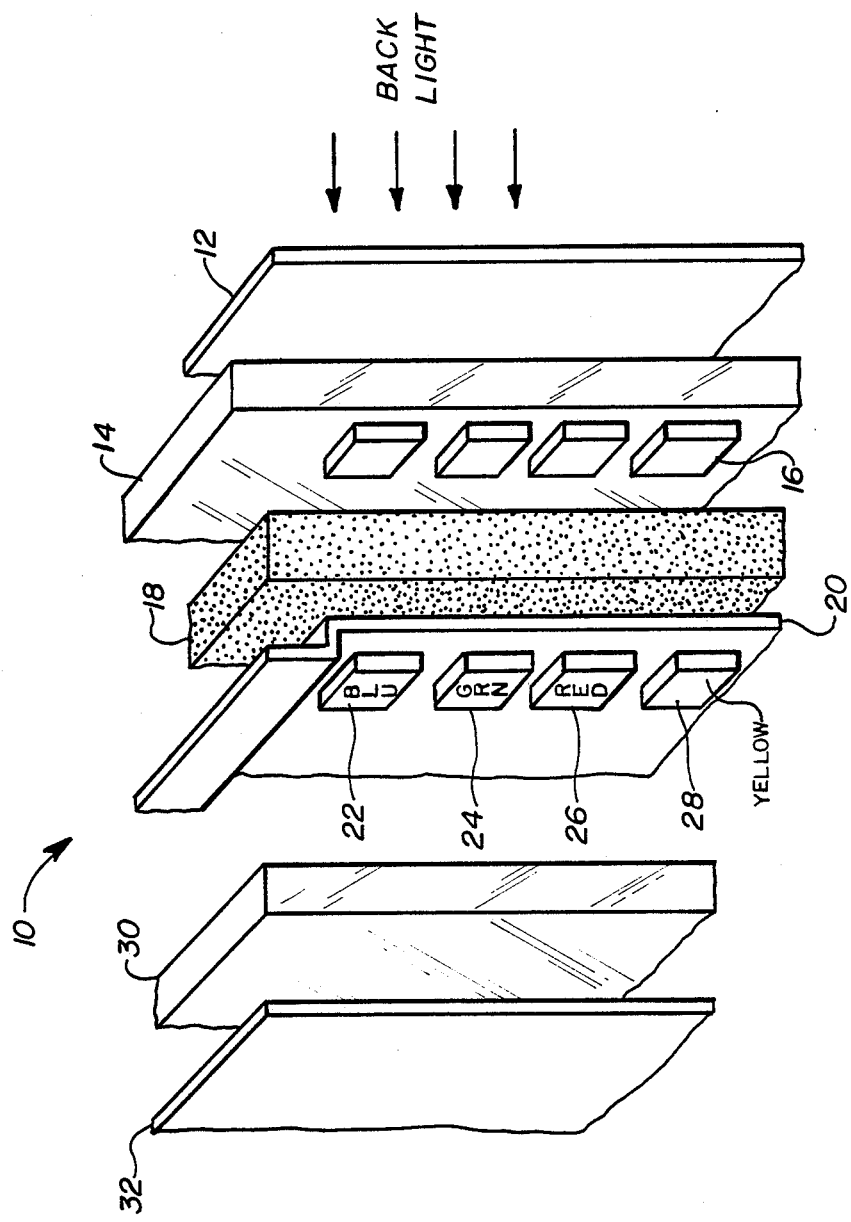

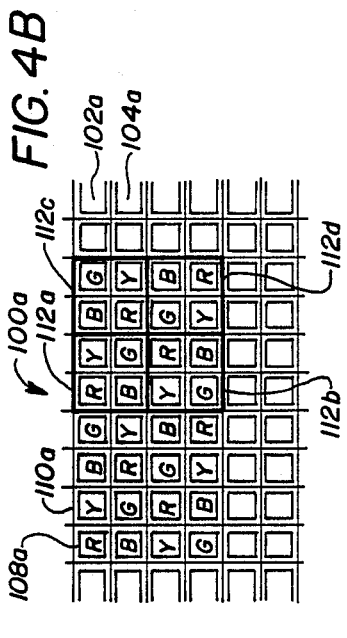
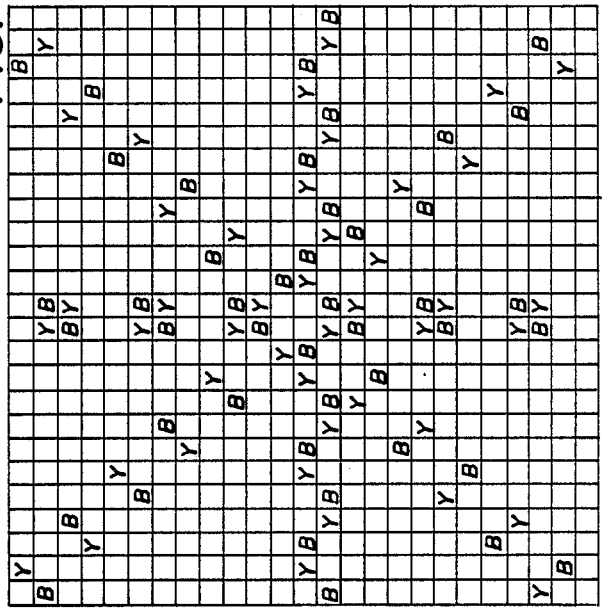
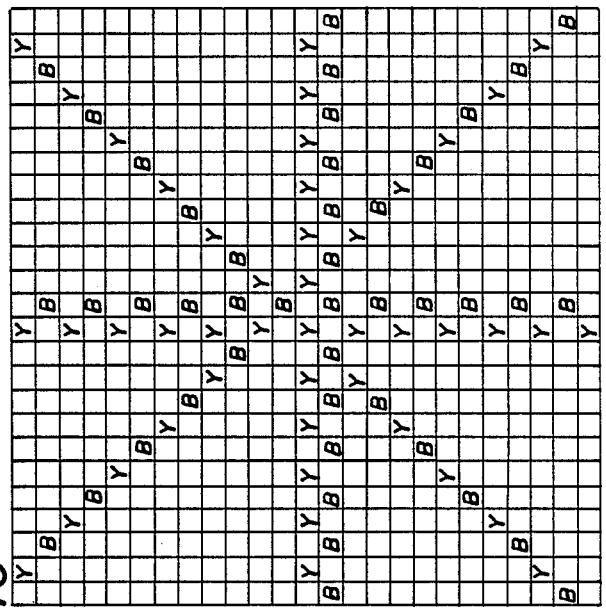

FOUR COLOR REPETITIVE SEQUENCE MATRIX ARRAY FOR FLAT PANEL DISPLAYS

BACKGROUND OF THE INVENTION

1. Field of the Invention

This invention relates generally to pictorial communication and more particularly to flat-panel type color matrix display devices, such as those in which a discretely addressable matrix of red, green, and blue (R-G-B) picture elements are used to generate full-color alphanumeric, graphic and/or television-type video images.

2. Background of the Invention

The current generation of full-color matrix display devices do not possess sufficient pixel density to produce high-quality color images in all angular image orientations. Attempts to pack three primary color pixels (typically R-G-B) within a regular matrix, which greatly facilitates the construction and implementation of discrete pixel addressing schemes, produces asymmetrical angular resolution for images of different colors. Insufficient pixel density and asymmetrical angular resolution manifest themselves as image coarseness and color "fringing or aliasing". Coarseness and/or asymmetry of R and G primaries are particularly problematic, especially for the mixture colors yellow (R+G) and white (R+G+B). The problem arises due to the human visual system's high degree of resolution acuity for R and G. This makes the fusion of R and G primary elements difficult at practical levels of discrete element pixel density.

Two approaches have been investigated to solve this problem. The first, and most obvious, is to increase the pixel density to the point where discrete element quantization effects become insignificant. Extremely high pixel density appears to be impractical due to limitations relating to manufacturability, cost, and driver complexity. The second approach has been to define optimized geometric arrangements of R-G-B elements which minimize color fringe/aliasing effects and enable a useable resolution to be achieved in all angular image orientations. This second approach has proven difficult, primarily because of limitations relating to relatively low pixel density (coarseness) and suboptimal geometry in attempting to pack 3-color R-G-B triads into a regular orthogonal matrix. Arrangements of pixels into quatrads rather than triads has helped the angular effects, however, color fringes when combining R and G elements have continued to be difficult to eliminate.

The foregoing illustrates limitations known to exist in present devices. Thus, it is apparent that it would be advantageous to provide an alternative directed to overcoming one or more of the limitations set forth above. Accordingly, a suitable alternative is provided including features more fully disclosed hereinafter.

SUMMARY OF THE INVENTION

In one aspect of the present invention, this is accomplished by providing a color matrix array including a plurality of four color pixel patterns in the matrix. Each pattern includes R-G-B pixels and a yellow (Y) pixel. The matrix comprises a plurality of adjacent rows and adjacent columns. Each pattern is formed by the intersection of any two adjacent rows with any two adjacent columns.

The foregoing and other aspects will become apparent from the following detailed description of the invention when considered in conjunction with the accompanying drawing. It is to be expressly understood, however, that the drawing is not intended as a definition of the invention but is for the purpose of illustration only.

BRIEF DESCRIPTION OF THE DRAWING

In the drawing:

FIG. 1 is a perspective view illustrating an embodiment of major device components to a color image forming color pixel matrix;

Figures 3C, 3D:
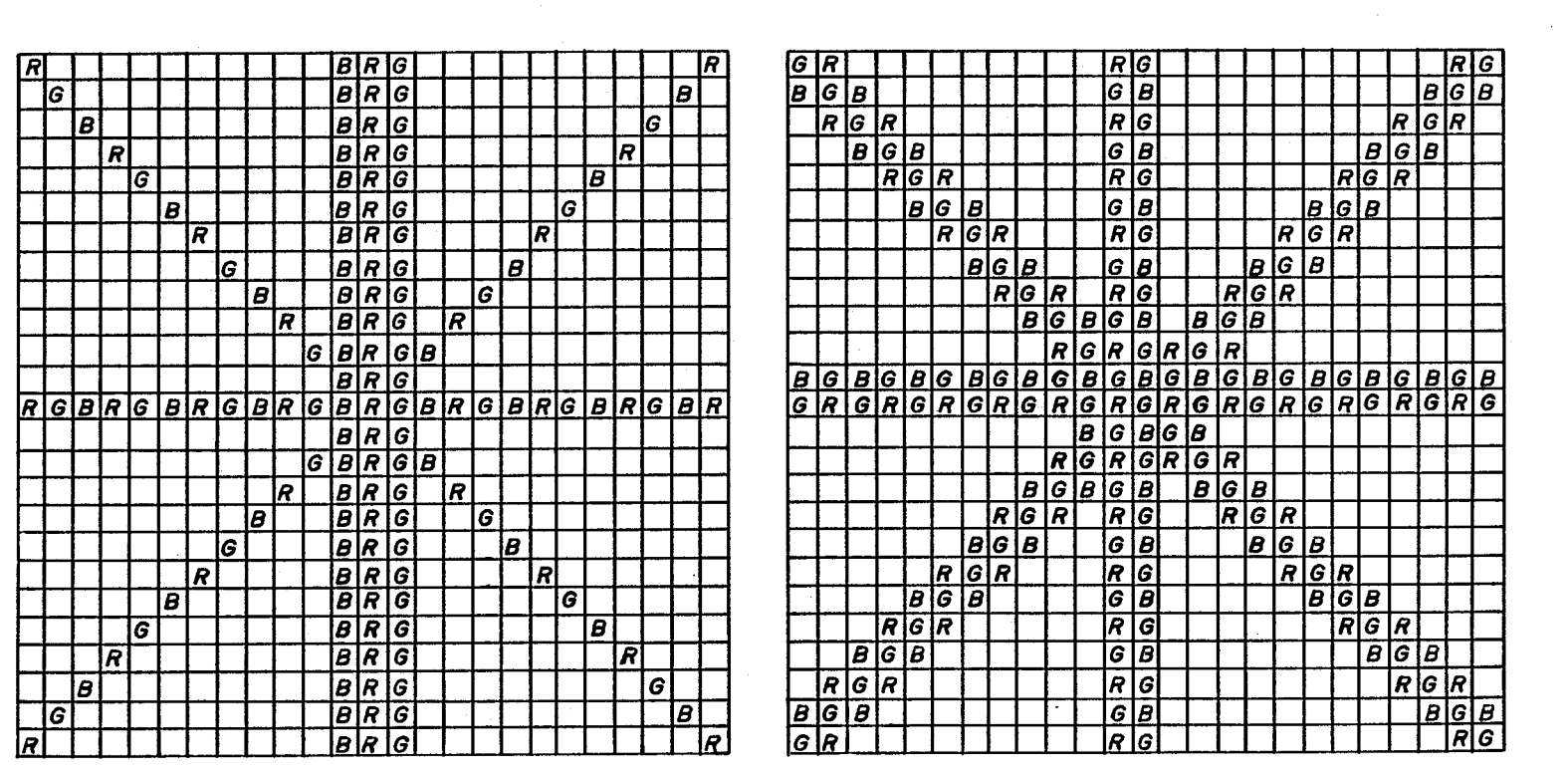

FIGS. 3a, 3b, 3c and 3d are diagrammatic views illustrating white lines in vertical, horizontal and two 45 degree angular orientations for the pixel arrangements illustrated in FIGS. 2a, 2b, 2c and 2d; and FIGS. 4a, 4b, 4c and 4d, are diagrammatic views illustrating embodiments of a color matrix array and the resulting white lines in accordance with this invention.

DESCRIPTION OF THE PREFERRED EMBODIMENT

Figure 2B:
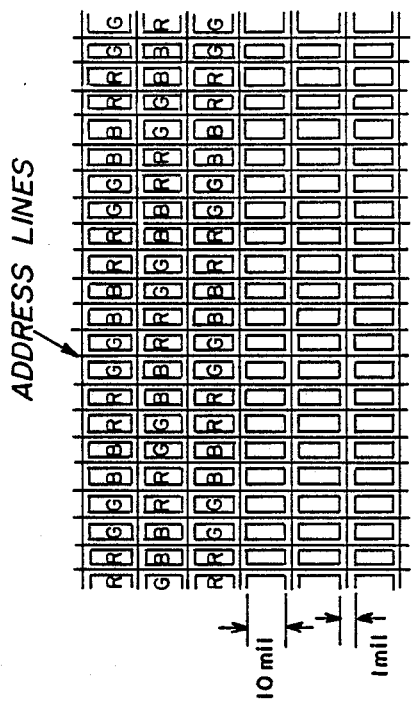
FIG. 2a, 2b, 2c and 2d, are diagrammatic views illustrating previously developed color pixel arrangements for matrix displays.

A color matrix display may employ any number of techniques to generate full color imagery. The display may be self-luminous, as in the case of multi-color light emitting diode (LED) matrix displays or matrix addressed electroluminescent (EL) panels. The display may also be non-self-luminous, such as in liquid crystal (LC) matrix displays in which electronic control of LC molecule alignment and orientation enable incident light to be either transmitted or absorbed. A passive non-self-luminous device such as an LC matrix display is often described as a "light valve" in that the pixels serve to form a quantized image by selectively passing or obstructing light from an external source. The common feature in creating full-color imagery with all current matrix display technologies is the mosaic of color primary elements, typically R-G-B. In the case of self-luminous devices, separate emitters which each produce light in one of the wavelength bands of the primary colors are required, and these separate emitters are arranged to produce the color matrix pixel pattern. In the case of the passive, non-self-luminous device, such as the LC matrix, a color filter array is imposed over the matrix of individual light valves and aligned such as to produce a mosaic of color pixels. Again, these are typically R-G-B filter elements. FIG. 1 is a diagram of a typical passive color matrix device generally designated 10, is modified to add a fourth color, yellow (Y) which reveals the relationship among device components and the color filter array which determines the color pixel arrangement. The concept and properties of the color pixel arrangement are the major subject matter of this invention.

Device 10 is subjected to a back light and comprises a polarizer 12, and a glass substrate 14 including a plurality of thin film transistors 16. A well-known liquid crystal material 18 is between substrate 14 and a common electrode 20 including B-G-R-Y color filters 22, 24, 26, 28, respectively. Another glass substrate 30 and polarizer 32 complete the elements of device 10.

Figure 2A:
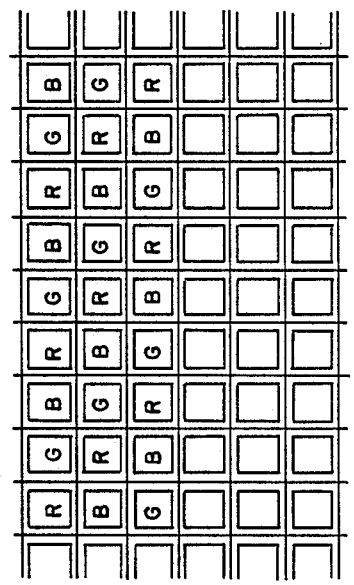
Figure 2D:
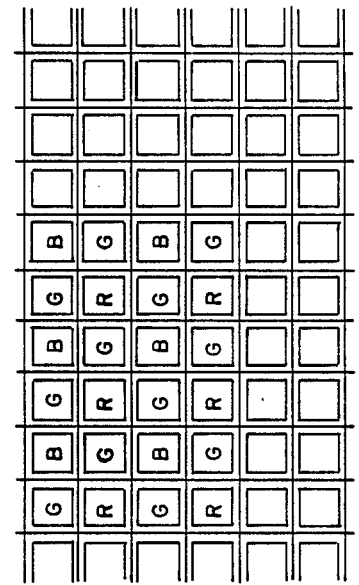
Figure 2C:
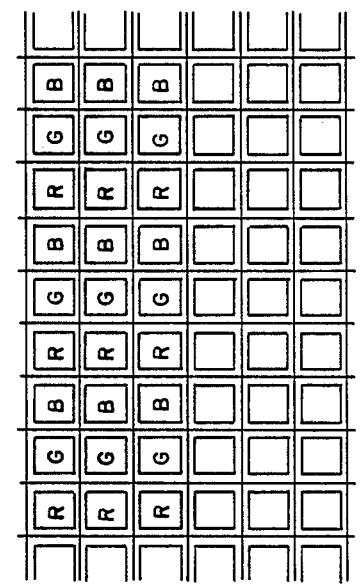
Figure 3A:
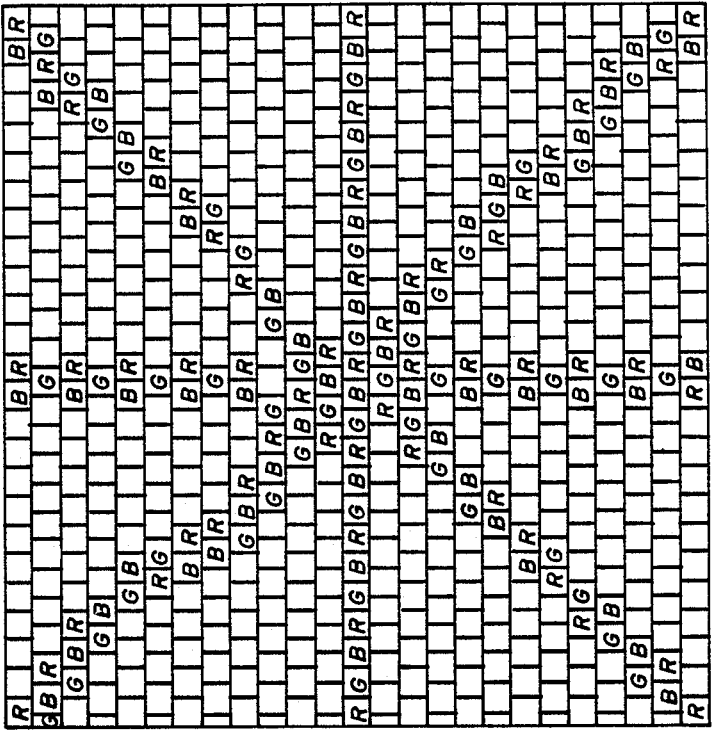
Figure 3B:
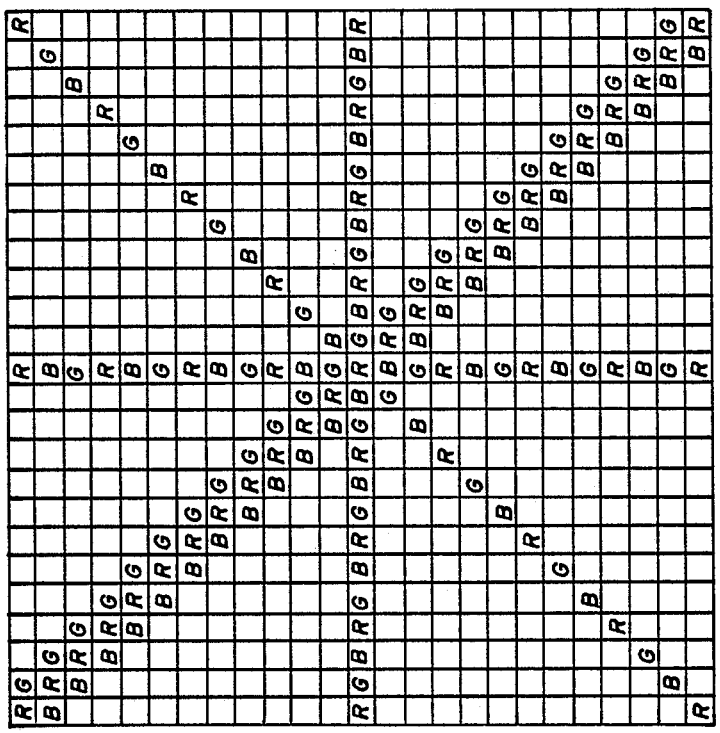

FIGS. 2a, 2b, 2c, and 2d illustrate four color pixel arrangements which are known to be either under investigation or implemented for color matrix displays. FIG. 2a shows an R-G-B arrangement with a diagonal orientation of color primaries. FIG. 2b shows an R-G-B arrangement in which the primary color pixels are packed in triads. This has an offset structure, reminiscent of color triad arrangements commonly used on delta gun shadow-mask color cathode ray tubes. FIG. 2c depicts an R-G-B pattern with a vertical stripe orientation of color primaries. This pattern is reminiscent of in-line gun shadow mask color cathode ray tubes. FIG. 2d shows a four-element R-G-B-G pattern. The only known prior patent for a 4-pixel arrangement of primary color elements is for an R-G-B-G pattern used to produce a color filter array for sensor elements of a charge coupled device color video camera.

FIGS. 3a, 3b, 3c, and 3d show synthesized white lines composed of R-G-B elements in vertical, horizontal, and two 45 degree orientations for each of the four color pixel arrangements described above and in FIGS. 2a, 2b, 2c, and 2d. The letter designation in each of the two sets of figures are correlated in that each letter is associated with one of the four pixel arrangements. It should be noted that in the four-element pattern of FIGS. 2d and 3d, the two, redundant G elements would each be driven so as to produce half the total required green luminance at each of the two G pixels. The importance of FIGS. 3a, 3b, 3c, and 3d is the illustration of varying degree of line width non-uniformity and "stair stepping" or "aliasing" of straight lines as a function of the angular orientation of the lines and the arrangement of primary color pixels. The four-element pattern of FIG. 2d is seen to produce the most uniform linewidths and least amount of stair-stepping or aliasing. This is the result of the more angularly symmetrical packing of four-element color pixels in a regular rectangular matrix than any of the three-element patterns. What is not apparent from a monochromatic representations of FIGS. 3a, 3b, 3c, and 3d are the color fringe patterns or color aliasing typically observed in the different color pixel arrangments as a function of angular orientation of line images. These effects are dependent upon the size, chromaticity, luminance, and shape of individual color pixels and thus are not easily demonstratable in graphic form or in monochrome. The effects are easily observable in current color matrix displays, and are primarily attributable to the lack of sufficient visual integration of R and G elements, a function of the good resolving capability of the human visual system for medium G and long R wavelengths of the visible spectrum. For example, in a Y image composed or R and G elements the observer sees an image with a yellowish appearance but is also able to resolve individual R and G elements. Rather than a solid Y image, the image appears as being composed of a mosaic of individual elements. Furthermore, edge and asymmetry affects can cause specific primary colors to accumulate at the edge of images resulting in pronounced primary color finges and poor image quality. The severity of image degradation varies with the color pixel arrangement and the angular orientation of lines used to construct the image. The same is true for white images composed of R-G-B elements. The R and G elements are individually resolvable, even at relatively small pixel sizes (e.g. 0.008-0.010 inches) and at normal viewing distances estimated at approximately 20-28 inches. However, owing to the unique nature of the short wavelength (B sensitive) visual mechanism, B elements at the appropriate relative luminance level for white mixture are virtually un-resolvable under the same conditions.

Embodiments of color matrix array 100, 100a in accordance with this invention are illustrated in FIGS. 4A, 4B, respectively. Array 100, FIG. 4A comprises a plurality of adjacent rows 102, 104. Each row 102, 104 includes a plurality of picture elements (pixels) 106. Rows 102, 104 extend in a first direction indicated by the directional arrow designated F. Array 100 also comprises a plurality of adjacent columns 108, 110. Each column 108, 110 also includes a plurality of pixels 106. Columns 108, 110 extend in a second direction, normal to the first direction, and indicated by the directional arrow designated S.

Each array of either FIG. 4A or 4B includes a plurality of four-color-pixel patterns 112 formed by the intersection of any two adjacent rows with any two adjacent columns. Each pixel pattern includes an R, Y, B and G pixel.

Specific to the array of FIG. 4A, one of the rows 102 includes an alternating pattern of two of the four pixels, e.g. R and Y. Adjacent row 104 includes an alternating pattern of another two of the four pixels, e.g. B and G. One of the columns 108 includes an alternating pattern of two of the four pixels, e.g. R and B. Adjacent column 110 includes an alternating pattern of another two of the pixels, e.g. Y and G. As a result, a single four-color pixel pattern 112 is repeated throughout the matrix.

Specific to the array of FIG. 4B, each adjacent row, includes a sequential pattern of each of the four pixels, e.g. row 102a includes R, Y, B and G pixels and row 104a includes B, G, R and Y pixels. Each adjacent column includes a sequential pattern of each of the four pixels, e.g. column 108a includes R, B, Y and G pixels. Adjacent column 110a includes Y, G, R and B pixels. As a result four, four-color pixel patterns 112a, 112b 112c, 112d, are sequentially repeated throughout the matrix.

FIGS. 4a and 4b reveal the pattern or invention, while FIGS. 4c and 4d depict synthesized white lines in vertical, horizontal, and two 45 degree orientations produced by the R-G-B-Y pixel arrangements. FIG. 4a shows a R-G-B-Y pattern in which the same 4-pixel R-G-B-Y element is repeated regularly throughout the matrix. FIG. 4b shows a variant of the pattern in which rows of the R-G-B-Y pattern alternate simply in horizontal dimension of the matrix and columns of the pattern alternate simply in the vertical dimension of the matrix.

The pattern of FIG. 4b, while slightly more complex, enables more symmetrical lines to be produced in angles just slightly off the major horizontal and vertical dimensions. The uniformity of linewidths and relative freedom from stair-stepping or aliasing is apparent from FIGS. 4c and 4d. Again, color specific properties cannot be depicted in a monochromatic representation.

What is evident from full-color images of correct size, chromaticity, and luminance, is the absence of color fringe patterns or color aliasing in images produced by the R-G-B-Y color pixel arrangement. The invention allows color images in R, G, B and Y to be produced by single primary color elements, while the matrix colors magenta (R+B), cyan (G+B), and white (Y+B) are generated by a maximum of two primary colors, one of which is always B. Since B has special characteristics in being extremely potent in determining chromaticity at luminance levels where it is barely resolvable (if at all), all mixture colors appear as a single, homogeneous image whose chromaticity is determined by the mixture of the two primaries but whose brightness and geometric appearance are determined virtually solely by the non-blue primary element. The improvements in color matrix display image quality resulting from the utilization of the present invention are highly significant and often dramatic.

The foregoing has described devices for the display of color which utilize a number of discretely addressable pixels each of which will produce a single primary color when activated and when appropriately activated in combination with other color pixels, will form a spatially synthesized full color image. More specifically the present invention relates to flat-panel type color matrix display devices, such as those in which a discretely addressable matrix of R-G-B picture elements are used to generate full-color alphanumeric, graphic and/or television-type video images. The present invention includes an additional primary color, Y, to produce a four primary color system R-G-B-Y.

The present invention employs a 4-primary color pattern. The 4-color pattern has two major advantages for the design of limited resolution, color matrix displays: (1) the inclusion of a Y primary eliminates the need for problematic R+G color mixes in that Y can be produced by a single element rather than a R+G mix and white can be produced by a Y+B mix rather than the typical R+G+B combination; and (2) angular asymmetries for either single or double element lines are minimized for all primary and mixture colors. Previous basic color vision experiments have indicated that blue chromaticity integrates over a large spatial area. Blue, therefore effectively enables color change but contributes very little to luminance or visible resolution. By adding the Y primary color, this feature of human vision is used to advantage by enabling all secondary or mixture colors to be produced by either a R, G or Y primary color, this feature of human vision is used to advantage by enabling all secondary or mixture colors to be produced by either a R, G or Y primary in combination with B. The R, G or Y primaries need not be activated in combination to produce mixture colors. When B is used in combination with other primaries, it enables the color to be changed without producing observable fringe patterns or growth in linewidth. The reduction or elimination of angular asymmetry is an additional benefit resulting from the fact that a 4-color primary pixel pattern can be packed more symmetrically in a regular matrix than a 3-color primary pattern. This minimizes jagged edges on lines of various angular orientations and also serve to minimize color fringing or aliasing.

The significant advantages of the 4-color (R-G-B-Y) pixel arrangement are: (1) minimization of perceived color fringe or color aliasing problems; and (2) better symmetry of various colored lines or images across angular orientations. The first advantage is derived by appealing to the human visual system's large area spatial chromatic integration function for short-wavelengths and poor short-wavelength luminance resolution, while the advantage of greater symmetry is due to the ability to achieve a more angularly symmetric geometry when packing a 4-color primary pixel arrangement into a regular matrix. These two features enable much better color matrix display image quality to be achieved with the present invention without the cost and complexity of increasing pixel density.

Having thus described the invention, what is claimed is:

1. A color matrix array comprising:
   a plurality pixels, each being one of four colors; blue, green, red, or yellow arranged to form a matrix of rows and columns wherein said columns are perpendicular to said rows;
   each row in said matrix having a repetitive sequence of said four colors, each row in a set of four rows commencing with a different one of said four colors such that a first group of two contiguous rows in said set of four rows have a first repetitive row sequence of said four colors and a second group of contiguous rows having a second repetitive row sequence of said four colors, thereby establishing repetitive sets of four rows;
   said first and second row sequences arranged such that a repetitive set of four columns is established wherein a first group of two contiguous columns have a first repetitive column sequence of said four colors and a second group of two contiguous columns have a second repetitive column sequence of said four colors, said first and second row sequences with said first and second column sequences establishing blocks of four elements in said matrix formed by two rows and two columns wherein each block contains said four colors one in each element.

* * * * *